US 008122187B2

(12) United States Patent
Walker et al.

(10) Patent No.: US 8,122,187 B2
(45) Date of Patent: Feb. 21, 2012

(54) REFRESHING DYNAMIC VOLATILE MEMORY

(75) Inventors: Robert Michael Walker, Raleigh, NC (US); Perry Willmann Remaklus, Jr., Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 11/150,649

(22) Filed: Jun. 10, 2005

(65) Prior Publication Data

US 2006/0002217 A1 Jan. 5, 2006

Related U.S. Application Data

(60) Provisional application No. 60/585,310, filed on Jul. 2, 2004.

(51) Int. Cl.
*G06F 12/00* (2006.01)
(52) U.S. Cl. ...................................................... 711/106
(58) Field of Classification Search .................... 711/106
See application file for complete search history.

(56) References Cited

U.S. PATENT DOCUMENTS

| | | | |
|---|---|---|---|
| 5,278,796 A | 1/1994 | Tillinghast et al. | |
| 5,600,281 A | 2/1997 | Mori et al. | |
| 5,787,255 A | 7/1998 | Parlan et al. | |
| 5,982,697 A | 11/1999 | Williams et al. | |
| 6,134,167 A | 10/2000 | Atkinson | |
| 6,324,482 B1 * | 11/2001 | Nakagaki et al. | 702/104 |
| 6,373,768 B2 | 4/2002 | Woo et al. | |
| 6,401,213 B1 | 6/2002 | Jeddeloh | |
| 6,438,057 B1 | 8/2002 | Ruckerbauer | |
| 6,449,685 B1 | 9/2002 | Leung | |
| 6,453,218 B1 | 9/2002 | Vergis | |
| 6,489,831 B1 | 12/2002 | Matranga et al. | |
| 6,667,905 B2 | 12/2003 | Dono et al. | |
| 6,728,798 B1 | 4/2004 | Roohparvar | |
| 6,757,857 B2 | 6/2004 | Lamb et al. | |
| 6,778,459 B2 | 8/2004 | Blodgett | |
| 6,937,958 B2 | 8/2005 | Gold et al. | |
| 6,957,308 B1 | 10/2005 | Patel | |
| 7,096,283 B2 | 8/2006 | Roohparvar | |
| 7,230,876 B2 | 6/2007 | Walker | |
| 7,251,192 B2 | 7/2007 | Walker | |
| 7,304,905 B2 | 12/2007 | Hsu et al. | |
| 7,395,176 B2 | 7/2008 | Chung et al. | |

(Continued)

FOREIGN PATENT DOCUMENTS

EP 0797207 A2 9/1997

(Continued)

OTHER PUBLICATIONS

European Search Report—EP10165753, Search Authority—Munich Patent Office, Aug. 12, 2010.

(Continued)

*Primary Examiner* — Midys Rojas
(74) *Attorney, Agent, or Firm* — Nicholas J. Pauley; Peter M. Kamarchik; Jonathan T. Velasco

(57) ABSTRACT

A memory system, and process for refreshing the memory, is disclosed. The memory system includes memory, a temperature sensor configured to measure the temperature of the memory, and a memory controller configured to refresh the memory at a refresh rate, the refresh rate being controlled as a function of the temperature measured by the temperature sensor.

28 Claims, 3 Drawing Sheets

U.S. PATENT DOCUMENTS

| | | |
|---|---|---|
| 7,421,525 B2 | 9/2008 | Polzin et al. |
| 2001/0014049 A1 | 8/2001 | Woo et al. |
| 2002/0056022 A1 | 5/2002 | Leung |
| 2002/0078282 A1 | 6/2002 | Drerup et al. |
| 2002/0147949 A1 | 10/2002 | Lamb et al. |
| 2002/0152351 A1* | 10/2002 | Tanaka .......................... 711/105 |
| 2002/0180543 A1* | 12/2002 | Song et al. .................... 331/176 |
| 2003/0095455 A1 | 5/2003 | Dono et al. |
| 2003/0158696 A1 | 8/2003 | Gold et al. |
| 2003/0174568 A1 | 9/2003 | Blodgett |
| 2004/0071191 A1* | 4/2004 | Sim et al. ...................... 374/185 |
| 2004/0230718 A1 | 11/2004 | Polzin et al. |
| 2005/0007864 A1 | 1/2005 | Chung et al. |
| 2005/0060481 A1 | 3/2005 | Belonoznik |
| 2006/0239095 A1 | 10/2006 | Shi et al. |
| 2006/0265615 A1 | 11/2006 | Janzen et al. |
| 2006/0294294 A1 | 12/2006 | Walker |
| 2007/0047378 A1 | 3/2007 | Wolford et al. |

FOREIGN PATENT DOCUMENTS

| | | |
|---|---|---|
| EP | 0851427 A2 | 7/1998 |
| JP | 06175747 | 6/1994 |
| JP | 8124380 | 5/1996 |
| JP | 8315569 | 11/1996 |
| JP | 2000067576 A | 3/2000 |
| JP | 2002343079 | 11/2002 |
| JP | 2004505404 | 2/2004 |
| JP | 2005032428 | 2/2005 |
| JP | 2008505429 | 2/2008 |
| KR | 2003044314 * | 6/2003 |
| WO | WO 00/11675 * | 3/2000 |
| WO | WO0011675 A1 | 3/2000 |

OTHER PUBLICATIONS

Gillingham P et al: "SLDRAM:High Performance, Open-Standard Memory"IEEE Micro, IEEE Service Center, Los Alamitos, CA, US, vol. 17, No. 6, Nov. 1997, pp. 29-39, XP000726002 ISSN: 0272-1732 pp. 31-36.

International Preliminary Examination Report, PCT/US06/006995—International Search Authority—European Patent Office—Dec. 24, 2007.

International Preliminary Examination Report—PCT/US06/024498, International Search Authority—European Patent Office-Dec. 24, 2007.

International Search Report and Written Opinion—PCT/US2005/023334, International Search Authority—European Patent Office—Dec. 28, 2005.

International Search Report—PCT/US06/006995, International Search Authority—European Patent Office—Oct. 30, 2006.

International Search Report—PCT/US06/024498, International Search Authority—European Patent Office—Apr. 10, 2007.

Jedec Standard; "Double Data Rate (DDR) SDRAM Specification", JESD79E (May 2005).

Written Opinion, PCT/US06/006995—International Search Authority—European Patent Office—Oct. 30, 2006.

Written Opinion—PCT/US06/024498, International Search Authority—European Patent Office—Apr. 10, 2007.

* cited by examiner

1

REFRESHING DYNAMIC VOLATILE MEMORY

RELATED APPLICATIONS

This application claims priority to U.S. Provisional Application No. 60/585,310, filed Jul. 2, 2004.

INCORPORATION BY REFERENCE

This application cross references U.S. application Ser. No. 11/0128,829, filed May 13, 2005, entitled REGISTER READ FOR VOLATILE MEMORY.

BACKGROUND

1. Field

The present disclosure relates generally to data processing, and more specifically, to techniques for refreshing dynamic volatile memories.

2. Background

Memory systems are used extensively today in data processing systems to store data needed by various processing entities. A memory system generally includes a memory controller that manages access to the memory. The memory is typically configured in a matrix structure formed by rows and columns of memory cells, with each memory cell being capable of storing a bit of data. A memory cell may be accessed by a processing entity, or other source, by providing the appropriate address to the memory controller. The address from the processing entity may be sent to the memory controller over a bus with the row address occupying the lower-order bits and the column address occupying the higher-order bits. The memory controller uses a multiplexing scheme to send the row address to the memory followed by the column address. This multiplexing scheme reduces the number of pins on the memory chip, and thereby lowers cost.

Modern digital systems typically use Random Access Memory (RAM) as the main memory. There are two basic types of RAM: Dynamic RAM (DRAM) and Static RAM (SRAM). The SRAM operates as a switch and requires multiple transistors for each memory cell. The DRAM, on the other hand, uses one transistor and a capacitor for each memory cell, making it the memory of choice because it is less expensive than the SRAM and occupies less real estate. However, the DRAM is not without its drawbacks. In particular, the capacitors are very small and tend to discharge rather quickly, requiring a refresh circuit to maintain the charge and thus the stored information. This refresh circuit, however, is a small price to pay in view of the cost and real estate savings of DRAMs.

In many data processing systems, the refresh function is controlled by the memory controller. At regularly given intervals (refresh rate), the memory controller refreshes the DRAM by reading every row in the memory, one row at a time. Due to the construction of the memory cells, the process of reading a row refreshes every cell in that row. The specific rate at which the memory is refreshed can have a significant impact on system performance. A refresh rate that is too slow may result in an unacceptable loss of data as the capacitors discharge. A refresh rate that is too fast, on the other hand, may result in unnecessary power consumption. The latter condition is of particular concern in battery operated devices, such as cellular and wireless telephones, laptops, personal digital assistants (PDA), and the like. Accordingly, there is a need in the art for a methodology to maintain an optimal refresh rate despite variations in system parameters. This methodology should be sensitive to temperature variations.

SUMMARY

An embodiment of a memory system is disclosed. The memory system includes memory, a temperature sensor configured to measure the temperature of the memory, and a memory controller configured to refresh the memory at a refresh rate, the refresh rate being controlled as a function of the temperature measured by the temperature sensor.

An embodiment of memory is disclosed. The memory includes a plurality of memory locations, and a temperature register configured to provide an encoded output corresponding to the temperature of the memory, the encoded output comprising information useable by an external source to control the refresh rate of the memory locations.

An embodiment of a memory controller is disclosed. The memory controller is configured to refresh memory at a refresh rate. The memory controller includes a refresh clock configured to receive a control signal relating to the temperature of the memory, and control the refresh rate of the memory as a function of the control signal.

An embodiment of a method for refreshing memory is disclosed. The method includes measuring the temperature of the memory, and controlling the refresh rate of the memory from a memory controller as a function of the measured temperature.

Another embodiment of a memory system is disclosed. The memory system includes memory, means for measuring the temperature of the memory, and means for refreshing the memory at a refresh rate, the refresh rate being controlled as a function of the measured temperature.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

In the following description, various techniques for refreshing a dynamic volatile memory will be described. These techniques may be used in any electronic device that requires dynamic memory, but are particularly well suited for battery operated wireless communication devices, where power is of paramount concern. Wireless telephones, personal digital assistants (PDA), laptops, game consoles, pagers, and cameras are just a few examples of devices that might benefit from the inventive concepts described throughout this disclosure. Accordingly, any reference to a wireless communications device is intended only to provide context for discussion, with the understanding that the inventive concepts have a wide range of applications.

Figure 1:
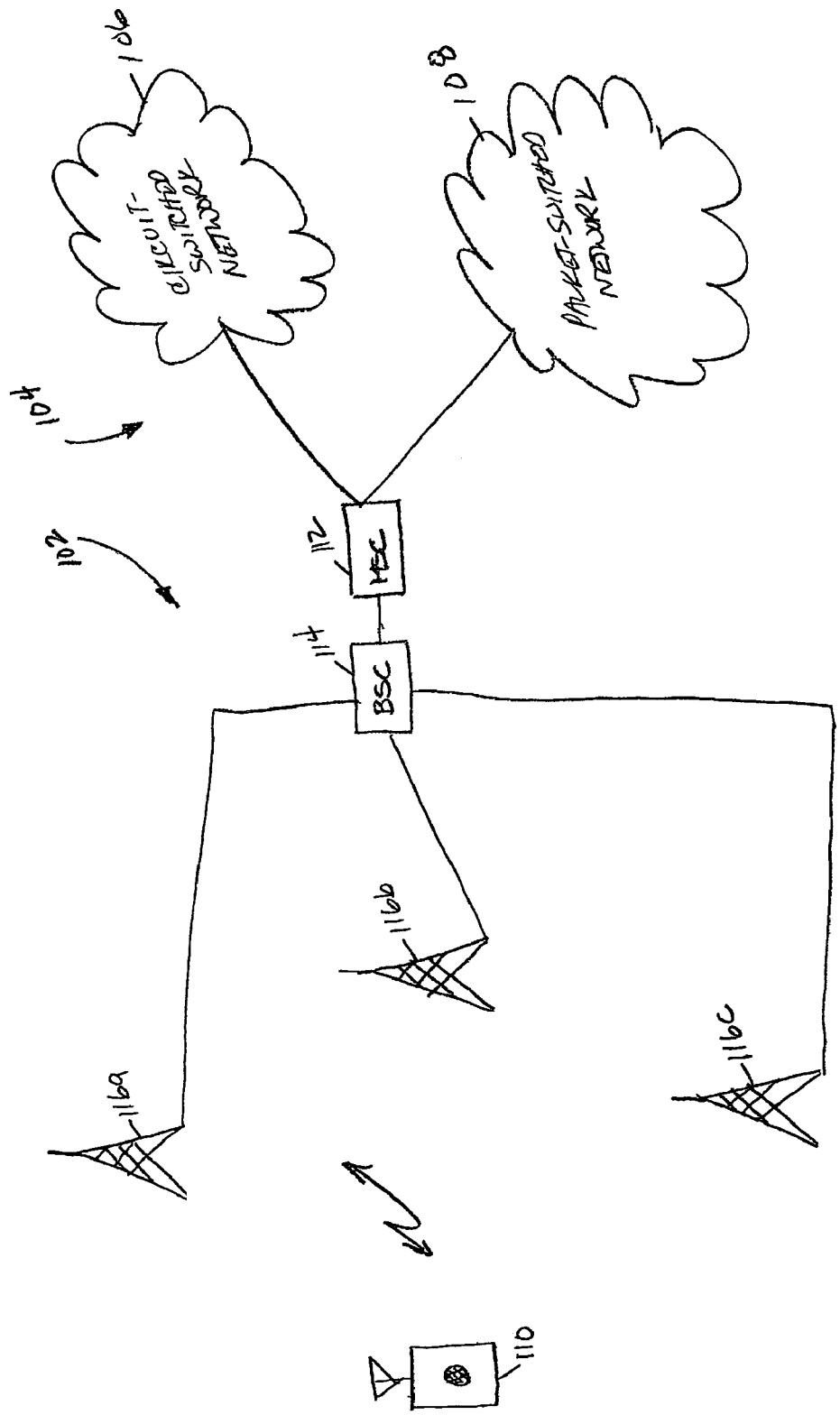
FIG. 1 is a conceptual block diagram illustrating an example of a wireless communications device operating in a telecommunications system.

FIG. 1 is a conceptual block diagram illustrating an example of a wireless communications device operating in a telecommunications system. The telecommunications system includes a wireless network 102 and a wired network 104. The wired network 104 may include a circuit-switched network 106, such as the Public Switched Telephone Network (PSTN), and/or a packet-switched network 108, such as the Internet or a corporate intranet.

The wireless network 102 may be used to support communications between the wireless communications device 110 and the circuit-switched and/or packet switched networks 106, 108. A Mobile Switching Center (MSC) 112 is used as the service provider in this example, providing access to the circuit-switch network 106 and/or the packet-switched network 108, however, as those skilled in the art will appreciate, any service provider may be used to interface the wireless communications device 110 to the wired network 104. The wireless network 106 also includes a Base Station Controller (BSC) 114, which controls one or more Base Station Transceivers (BTS) 116a-116c through the allocation and management of radio resources. Each BTS 116a-116c includes one or more transceivers placed at a single location to provide radio coverage throughout the entire wireless network 102.

Figure 2:
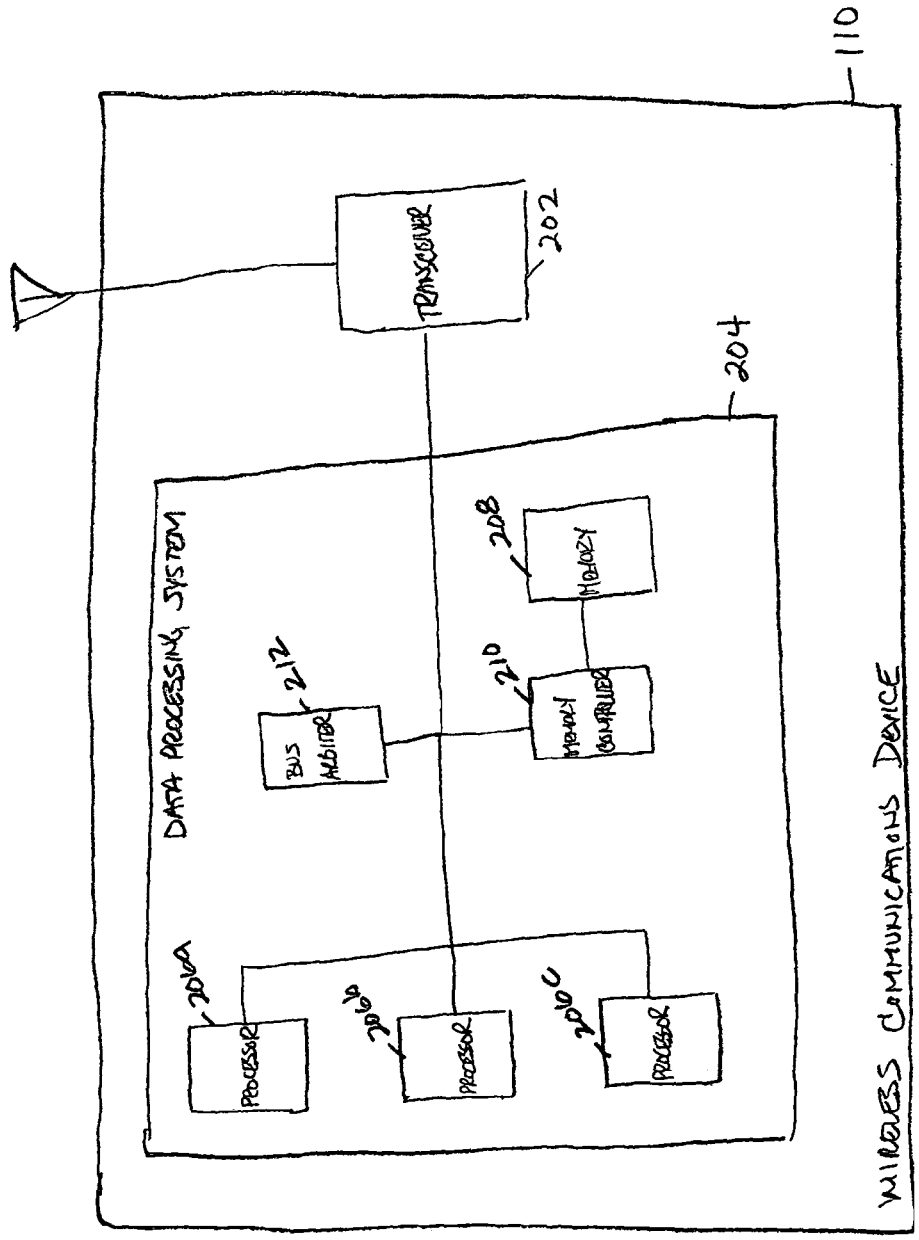
FIG. 2 is a conceptual block diagram illustrating an example of a wireless communications device.

FIG. 2 is a conceptual block diagram illustrating an example of a wireless communications device. The wireless communications device 110 may include a transceiver 202 to support radio communications with the wireless network 102 (see FIG. 1). A data processing system 204 may be used to provide various signal processing functions. The data processing system 204 is shown with three processors 206a-206c that may access shared memory 208 through a memory controller 210, but may be configured with any number of processors depending on the particular application and the overall design constraints. A bus arbiter 212 may be used to coordinate access between the various processors 206a-206c and the memory 208 by means well known in the art. The processors 206a-206c may be any type of bus mastering components including, by way of example, microprocessors, digital signal processors (DSP), bridges, programmable logic, discrete gates, transistor logic, or any other information processing components. In at least one embodiment of the data processing system 204, the memory 208 may be a dynamic volatile memory, such as a DRAM, a Synchronous DRAM (SDRAM), or any other component capable of retrieving and storing information.

Figure 3:
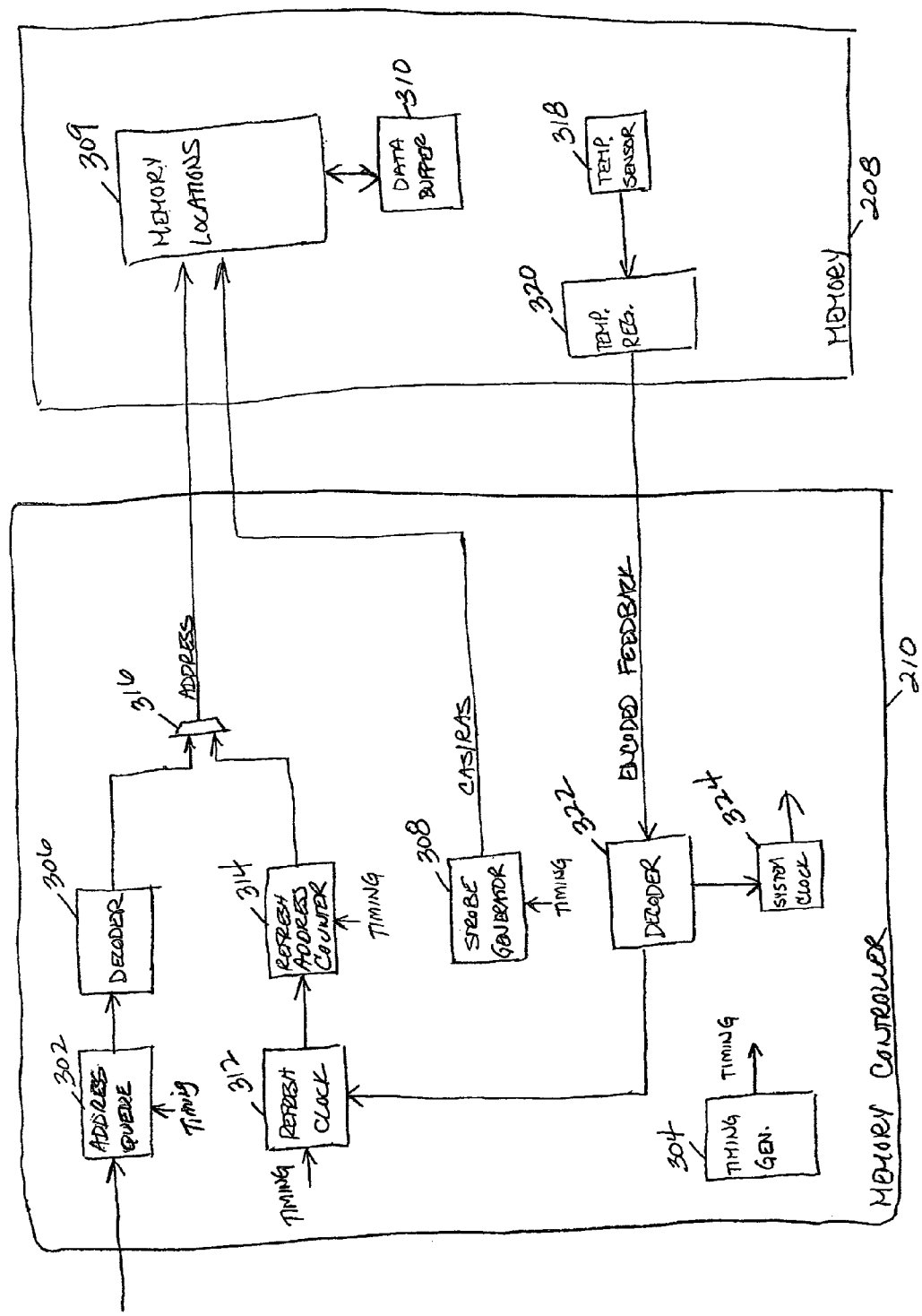
FIG. 3 is a conceptual block diagram illustrating an example of a memory controller and memory.

FIG. 3 is a conceptual block diagram illustrating an example of a memory controller and memory. The term "memory controller" is used to broadly define any component that controls the operation of the memory including a dedicated memory controller chip, a processor that directly controls the memory, controller circuitry on the memory chip itself, or any other suitable arrangement. The memory controller 210 may include an address queue 302 which receives an address from a processor 206 (see FIG. 2). The address includes a row address occupying the lower-order bits, and a column address occupying the higher-order bits. A timing generator 304 may be used to release one address at a time from the address queue 302 to a decoder 306. The decoder 306 may be used to separate the row address from the column address and send them to the memory 208, one after the other. The timing generator 304 may also be used to synchronize a strobe generator 308. The strobe generator 308 may be used to generate the various control signals required to access the memory 208.

The process of accessing the memory 208 begins with the row address being sent from the decoder 306 to the memory 208. At the same time, the strobe generator 308 sends a row address strobe (RAS) to the memory 208. The RAS causes an internal pointer in the memory 208 to move to the selected row. This action also refreshes the entire row of the memory 208. Next, the decoder 306 sends the column address to the memory 208. At the same time, the strobe generator 308 sends a column address strobe (CAS) to the memory 208.

In the case of a read operation, the contents of the memory location 309 specified by the address can now be read into a data buffer 310 before being transmitted to the processor (not shown). In the case of a write operation, content from the processor can now be written to the memory location 309 specified by the address via the data buffer 310.

The memory controller 210 may also be used to refresh the memory 208. The refresh rate is established by a refresh clock 312. The refresh clock 312 may be used to periodically create a window of time (refresh period) in which one or more rows in the memory 208 are refreshed. During the refresh period, a refresh address counter 314 generates a series of row addresses that are sent to the memory 208, one at a time, via a multiplexer 316. Accompanying each row address is a RAS from the strobe generator 308. The number of rows refreshed during each refresh period may vary depending on the specific application and the overall design constraints of the system. In some embodiments of the memory controller 210, each row of the memory 208 may be refreshed each refresh period.

The refresh rate may be varied to optimize performance by adjusting the refresh clock 312. The refresh rate may be varied based on any number of parameters, including by way example, temperature. To maintain optimal performance, the refresh rate should be increased as the temperature rises to avoid data loss in the memory 208. When the temperature decreases, the refresh rate may be reduced to avoid unnecessary power consumption. A temperature sensor 318 may be used to provide feedback to the memory controller 210 to adjust the refresh rate. The temperature sensor 318 may be provided with the memory 208, or located in close proximity to the memory 208. The temperature sensor 318 should be able to detect temperature over a wide range, but a narrow range may be acceptable in some applications. In one embodiment of the memory 208, the temperature sensor 318 can support a range extending from at least (¼)× to 4× the specified refresh rate at 85 C.

The temperature sensor output may be provided to a temperature register 320 in the memory 208. The temperature register 320 may be used to encode the temperature sensor output before it is fed back to memory controller 210. An example of a bit encoding scheme implemented by the temperature register 320 is shown below in Table 1.

TABLE 1

| Code | Refresh Rate Multiplier |
|---|---|
| 0000 | Not Used |
| 0001 | Out of Range |
| 0010 | (1/64)× |
| 0011 | (1/32)× |
| 0100 | (1/16)× |
| 0101 | (1/8)× |
| 0110 | (1/4)× |
| 0111 | (1/2)× |
| 1000 | 1× |
| 1001 | 2× |
| 1010 | 4× |
| 1011 | 8× |
| 1100 | 16× |
| 1101 | 32× |
| 1110 | 64× |
| 1111 | Out of Range |

Under this encoding scheme, the temperature register 320 will output "0001" if the temperature is below the temperature sensor range. Similarly, the temperature register 320 will output "1111" if the temperature exceeds the temperature sensor range. By providing an "Out of Range" code, the memory controller 210 may be able to take remedial action in addition to setting the refresh rate to its minimum or maximum value. By way of example, if the memory controller 210 receives feedback from the temperature register 320 indicating that the range of the temperature sensor 320 has been exceeded, i.e., "1111", the memory controller 210 can set the refresh rate to 64× the refresh rate specified at 85 C, and take steps to cool down the memory.

The encoded feedback from the temperature register 320 may be provided to a decoder 322 in the memory controller 210. The decoder 322 generates a control signal corresponding to the refresh multiplier rate specified in Table 1 for the encoded feedback. The control signal may be used to adjust the refresh clock 312. By way of example, if the encoded feedback is "1011," the decoder 322 will generate a control signal which will cause the refresh clock 312 to operate at 8× the refresh rate specified at 85 C. If the encoded feedback is "0111," the decoder 322 will generate a control signal which will cause the refresh clock 312 to operate at half the refresh rate specified at 85 C.

The temperature register 320 described thus far uses encoded feedback to represent a refresh rate multiplier. The refresh rate multiplier is applied by the memory controller 210 to the refresh rate specified by the manufacturer at 85 C. However, the refresh rate multiplier may be applied to any base refresh rate. Alternatively, the encoded feedback may represent a series of specific refresh rates for the memory controller 210.

In at least one embodiment, the temperature register 320 may be eliminated, and the digital output of the temperature sensor 318 fed directly back to the memory controller 210. In the event the temperature sensor 318 is designed with an analog output, the analog output can be converted to a digital format before being fed back to the memory controller 210.

The system clock 324 in the memory controller 210 may also be varied based on the temperature of the memory 208. As the temperature decreases, optimal performance may be maintained by increasing the speed of the system clock 324. When the temperature increases, the system clock 324 can be slowed down to conserve power. In some embodiments, the decoder 322 may be used to generate a control signal to adjust the speed of the system clock 324 based on the same encoded feedback used to adjust the refresh rate. In other embodiments, a separate temperature register (not shown) in the memory 208 may be required to adjust the system clock rate. As an alternative to separate temperature registers, a single temperature register may be used for encoding changes for both the refresh rate and the system clock rate by increasing the number of encoded feedback bits. An example of that approach is shown below in Table 2 for a portion of the encoded feedback extending from "011000" to "100111." In this example, the four most significant bits are used by the decoder 322 to adjust the refresh clock 312, and all six bits are used to adjust the system clock rate. The encoded feedback for the system clock may represent a clock rate multiplier that is applied by the memory controller 210 to the nominal clock rate specified by the manufacturer. Alternatively, the clock rate multiplier may be applied to any base rate, or the encoded feedback may represent a series of specific clock rates.

TABLE 2

| Code | Refresh Rate Multiplier | Clock Rate Multiplier |
|---|---|---|
| 011000 | (1/4)× | 1.40× |
| 011001 | (1/4)× | 1.35× |
| 011010 | (1/4)× | 1.30× |
| 011011 | (1/4)× | 1.25× |
| 011100 | (1/2)× | 1.20× |
| 011101 | (1/2)× | 1.15× |
| 011110 | (1/2)× | 1.10× |
| 011111 | (1/2)× | 1.05× |
| 100000 | 1× | 1× |
| 100001 | 1× | .95× |
| 100010 | 1× | .90× |
| 100011 | 1× | .85× |
| 100100 | 2× | .80× |
| 100101 | 2× | .75× |
| 100110 | 2× | .70× |
| 100111 | 2× | .65× |

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A memory system comprising:
    a memory including:
        a temperature sensor configured to measure a first temperature of the memory and to provide a first temperature output corresponding to the measured first temperature, wherein the first temperature output comprises first temperature data bits; and
        a rewritable temperature register configured to encode the first temperature output using a bit encoding scheme in which the first temperature data bits are converted into first multiplier data bits, wherein a first portion of the first multiplier data bits represents a first refresh clock rate multiplier and a second portion of the first multiplier data bits represents a first system clock rate multiplier, and wherein the second portion of the first multiplier data bits includes at least one data bit that is not included in the first portion of the first multiplier data bits; and
    a memory controller configured to receive the first multiplier data hits, the memory controller including:
        a refresh clock responsive to the first refresh clock rate multiplier to control an auto-refresh rate of the memory; and
        a system clock responsive to the first system clock rate multiplier to control a system clock rate of the memory controller.

2. The memory system of claim 1, wherein the refresh clock is configured to adjust the auto-refresh rate to equal a product of the first refresh clock rate multiplier and a base refresh rate.

3. The memory system of claim 2, wherein the first refresh clock rate multiplier has a value of between approximately one-fourth (¼) and approximately four (4).

4. The memory system of claim 1 wherein the first portion of the first multiplier data bits identifies a code corresponding to an out-of-range temperature that exceeds a range of the temperature sensor.

5. The memory system of claim 4, wherein in response to identification of the code, the refresh clock is configured to adjust the auto-refresh rate to equal a product of a maximum refresh clock rate multiplier and a base refresh rate.

6. The memory system of claim 5, wherein the maximum refresh clock rate multiplier has a value of approximately sixty-four.

7. The memory system of claim 5, wherein in response to the identification of the code, the memory controller is operative to invoke an automatic response in addition to the auto-refresh rate being adjusted, wherein the automatic response is directed to a reduction of memory temperature.

8. The memory system of claim 1, wherein the first portion of the first multiplier data bits includes at least four most significant data bits of the first multiplier data bits.

9. The memory system of claim 8, wherein the second portion of the first multiplier data bits includes at six data bits of the first multiplier data bits.

10. The memory system of claim 1, wherein the temperature sensor is configured to measure a second temperature of the memory and to provide a second temperature output corresponding to the measured second temperature, wherein the second temperature output comprises second temperature data bits, wherein the rewritable temperature register is configured to encode the second temperature output using the bit encoding scheme in which the second temperature data bits are converted into second multiplier data bits, wherein a first portion of the second multiplier data bits represents a second refresh clock rate multiplier and a second portion of the second multiplier data bits represents a second system clock rate multiplier, wherein the second measured temperature is greater than the first measured temperature, and wherein the second refresh clock rate multiplier is greater than the first refresh clock rate multiplier and the second system clock rate multiplier is less than the first system clock rate multiplier.

11. The memory system of claim 10, wherein a first ratio of the first refresh clock rate multiplier to the second refresh clock rate multiplier is different than a second ratio of the first system clock rate multiplier to the second system clock rate multiplier.

12. The memory system of claim 1, wherein the first portion of the first multiplier data bits is a subset of the second portion of the first multiplier data bits.

13. A memory controller comprising:
    an input to receive a control signal from a memory, the control signal associated with a measured temperature of the memory, the control signal including a plurality of data bits, a first set of the plurality of data bits identifying a refresh clock rate multiplier and a second set of the plurality of data bits identifying a system clock rate multiplier, and wherein the second set of the plurality of data bits includes at least one data bit that is not included in the first set of the plurality of data bits;
    a decoder to decode the received control signal into a first control signal corresponding to the refresh clock rate multiplier and into a second control signal corresponding to the system clock rate multiplier;
    a refresh clock to receive the first control signal and to control a rate at which a row address strobe is generated in response to the first control signal;
    a refresh address counter to generate a number of row address strobes during an auto refresh period; and
    a system clock to receive the second control signal and to control a system clock rate of the memory controller in response to the second control signal.

14. The memory controller of claim 13, wherein the refresh clock sets the rate at which the row address strobe is equal to a product of the refresh clock rate multiplier and a base refresh rate.

15. The memory controller of claim 13, wherein the control signal is received from a rewritable register of the memory that is configured to store the control signal.

16. A method of refreshing a memory, the method comprising:
    receiving at a memory controller an encoded control signal corresponding to a measured temperature of the memory, wherein the encoded control signal includes a plurality of data bits having a first set of data bits identifying a refresh clock rate multiplier and a second set of data bits identifying a system clock rate multiplier, wherein the second set of data bits includes at least one data bit that is not included in the first set of data bits, and wherein the memory controller accesses the memory;

decoding the received encoded control signal into a first control signal corresponding to the refresh clock rate multiplier and into a second control signal corresponding to the system clock rate multiplier;

controlling an auto-refresh rate of the memory from the memory controller as a function of the first control signal; and controlling a system clock rate of the memory controller as a function of the second control signal.

17. The method of claim 16, wherein the auto-refresh rate is equal to a product of the refresh clock rate multiplier and a base refresh rate.

18. The method of claim 16, wherein the first set of data bits identifies an out-of-range refresh rate multiplier corresponding to an invalid temperature measured by a temperature sensor.

19. The method of claim 16, wherein the encoded control signal is stored in a rewritable temperature register within the memory.

20. The method of claim 16, further comprising retrieving the encoded control signal from a rewritable register of the memory.

21. A memory system comprising:
a memory including:
means for measuring a temperature of the memory; and
means for generating an encoded control signal based at least in part on the measured temperature, a refresh clock rate multiplier, and a system clock rate multiplier, wherein the encoded control signal includes a first set of data bits identifying the refresh clock rate multiplier and a second set of data bits identifying the system clock rate multiplier, and wherein the first set of data bits includes at least one data bit but not all data bits of the second set of data bits; and
a memory controller for accessing the memory, the memory controller comprising:
means for decoding the encoded control signal into a first control signal corresponding to the refresh clock rate multiplier and into a second control signal corresponding to the system clock rate multiplier;
means for refreshing the memory at an auto-refresh rate, the auto-refresh rate being controlled as a function of the first control signal;
means for controlling a system clock rate of the memory controller, the system clock rate being controlled as a function of the second control signal; and
means for reading from and writing to the memory.

22. The memory system of claim 21, wherein the auto-refresh rate equals a product of the refresh clock rate multiplier and a base refresh rate.

23. The memory system of claim 22, wherein the refresh dock rate multiplier has a value of between approximately one-fourth (¼) and approximately four (4).

24. The memory system of claim 21, wherein the first set of data bits identities a code corresponding to an out-of-range temperature that exceeds a range of the means for measuring the temperature of the memory.

25. The memory system of claim 21, wherein the memory further comprises means for storing the encoded control signal in a rewritable register of the memory.

26. The memory system of claim 21, wherein the encoded control signal comprises six bits.

27. A method of refreshing a memory, the method comprising:
receiving at a rewritable temperature register first temperature data bits corresponding to a first measured temperature of a temperature sensor;
encoding the first temperature data bits using an encoding scheme in which the first temperature data bits are converted into first multiplier data bits representing a first refresh clock rate multiplier and a first system clock rate multiplier, wherein the first refresh clock rate multiplier is represented by at least one data hit but not all data bits that represent the first system clock rate multiplier; and
decoding the first multiplier data bits into a first control signal corresponding to the first refresh clock rate multiplier and into a second control signal corresponding to the first system clock rate multiplier, wherein the memory includes a refresh clock responsive to the first control signal to control an auto-refresh rate of the memory, and wherein a memory controller includes a system clock responsive to the second control signal to control a system clock rate of the memory controller.

28. The method of claim 27, further comprising:
receiving at the rewriteable temperature register second temperature data bits corresponding to a second measured temperature of the temperature sensor;
encoding the second temperature data bits using the encoding scheme in which the second temperature data bits are converted into second multiplier data bits representing a second refresh clock rate multiplier and a second system clock rate multiplier, wherein the second measured temperature is greater than the first measured temperature, and wherein the second refresh clock rate multiplier is greater than the first refresh clock rate multiplier and the second system clock rate multiplier is less than the first system clock rate multiplier; and
decoding the second multiplier data bits into a third control signal corresponding to the second refresh clock rate multiplier and into a fourth control signal corresponding to the second system clock rate multiplier, wherein the refresh clock is responsive to the third control signal to control the auto-refresh rate of the memory, wherein the system clock is responsive to the fourth control signal to control the system clock rate of the memory controller, and wherein a first difference between the first refresh clock rate multiplier and the second refresh clock rate multiplier is greater than a second difference between the first system clock rate multiplier and the second system clock rate multiplier.

* * * * *